United States Patent [19]
Limberg

[11] Patent Number: 5,805,241
[45] Date of Patent: Sep. 8, 1998

[54] NOISE-IMMUNE AUTOMATIC GAIN CONTROL FOR QAM RADIO RECEIVERS

[75] Inventor: Allen LeRoy Limberg, Vienna, Va.

[73] Assignee: Samsung Electronics Co., Ltd., Kyungki-Do, Rep. of Korea

[21] Appl. No.: 857,065

[22] Filed: May 15, 1997

Related U.S. Application Data

[60] Provisional application No. 60/018,017, May 21, 1996.

[51] Int. Cl.[6] ........................................... H04N 5/52
[52] U.S. Cl. ......................... 348/725; 375/262; 375/345; 375/346; 329/304
[58] Field of Search .................................. 348/433, 528, 348/475, 687, 641, 678–729, 725; 329/304–310; 375/235, 226, 232, 261–265, 298, 345, 348, 346, 340, 350; H04N 5/455, 5/53, 5/52

[56] References Cited

U.S. PATENT DOCUMENTS 5,235,424  8/1993  Wagner et al. ..................... 358/174
5,565,932  10/1996  Chitta et al. ........................ 348/678
5,636,252  6/1997  Patel et al. ........................ 348/729 X

*Primary Examiner*—Nathan J. Flynn
*Attorney, Agent, or Firm*—Sughrue, Mion, Zinn, Macpeak & Seas, PLLC

[57] ABSTRACT

Automatic gain control (AGC) for a quadrature-amplitude-modulation (QAM) digital radio receiver, such as used for receiving digital high-definition television transmissions, is provided immunity to the effects of the ringing of intermediate-frequency (IF) amplifiers at carrier frequency in response to impulse noise. The energy associated with the ringing of the IF amplifiers is at frequencies relatively close to the carrier of the IF signal as compared to data modulation. Filtering that suppresses the energy associated with the ringing of the IF amplifiers is used to recover information concerning the envelope variations of the QAM signal free from accompanying ringing energy, which envelope variations are then peak detected to develop AGC signals for the QAM digital radio receiver.

18 Claims, 11 Drawing Sheets

NOISE-IMMUNE AUTOMATIC GAIN CONTROL FOR QAM RADIO RECEIVERS

This is a complete application filed wider 35 U.S.C. 111 (a) claiming, pursuant to 35 U.S.C. 119(e)(1), benefit of the filing date of provisional application Ser. No. 60/018,017 filed May 21, 1996, pursuant to 35 U.S.C. 111(b).

FIELD OF THE INVENTION

The invention relates to automatic gain control (AGC) of quadrature-amplitude-modulation (QAM) radio receivers and, more particularly, to improving the immunity of the AGC to ringing of the intermediate-frequency (IF) amplifiers by impulse noise.

BACKGROUND OF THE INVENTION

Radio receivers having the capability of receiving digital television (DTV) signals, which may be high-definition television (HDTV) signals, have recently become of interest. The transmission of DTV signals using quadrature amplitude modulation (QAM) of the principal carrier wave are being used in satellite-linik narrowcast systems and in some cable systems. The transmission of DTV signals using vestigial sideband amplitude modulation (VSB-AM) of a principal carrier wave will be used for terrestrial broadcasting in the United States. Processing after symbol decoding is similar in receivers for the VSB-AM DTV signals and in receivers for the QAM DTV signals, since data compression is done in accordance with the MPEG-2 standard prior to symbol encoding both in transmitters for the VSB-AM DTV signals and in transmitters for the QAM DTV signals. The data recovered by symbol decoding are supplied as input signal to a data de-interleaver, and the de-interleaved data are supplied to a Reed-Solomon decoder. Error-corrected data are supplied to a data de-randomizer which regenerates packets of data for a packet decoder. Selected packets are used to reproduce the audio portions of the DTV program, and other selected packets are used to reproduce the video portions of the DTV program. Tuners can be quite similar in receivers for the VSB-AM DTV signals and in receivers for the QAM DTV signals if the signals are in a common reception band or have been converted to be so. The differences in the receivers reside in the synchrodyning procedures used to translate the final intermediate-frequency (IF) signal(s) to baseband, in the symbol decoding procedures and in the automatic gain control (AGC) circuitry. There can also be differences in filtering for the IF amplification of the VSB-AM DTV signals and the IF amplification of the QAM DTV signals. A television receiver that is capable of receiving either VSB-AM or QAM DTV signals is more economical in design if it does not duplicate the similar tuner circuitry prior to synchrodyning to baseband and the similar receiver elements used after the symbol decoding circuitry.

In U.S. Pat. No. 5,508,755 issued 16 Apr. 1996, entitled AUTOMATIC GAIN CONTROL SYSTEM FOR A HIGH DEFINITION TELEVISION RECEIVER RADIO RECEIVER FOR RECEIVING BOTH VSB AND QAM DIGITAL HDTV SIGNALS, and incorporated herein by reference, Dr. Chandrakant B. Patel and the inventor have described solutions to the challenge of optimally constructing the circuitry for synchrodyning to baseband and for symbol decoding to accommodate both DTV transmission standards. These solutions involve the use of final-IF-amplifier frequencies that are low enough in frequency as to permit their digitization prior to the synchrodyning procedures used to translate the final-IF signal(s) to baseband. In U.S. Pat. No. 5,506,636 issued 9 Apr. 1996, entitled RADIO RECEIVER FOR RECEIVING BOTH VSB AND QAM DIGITAL HDTV SIGNALS HDTV SIGNAL RECEIVER WITH IMAGINARY-SAMPLE-PRESENCE DETECTOR FOR QAMN/VSB MODE SELECTION, and incorporated herein by reference, Dr. Chandrakant B. Patel and the inventor have described the automatic selection of the appropriate mode of reception for the DTV transmission currently being received.

Vestigial sideband amplitude-modulation (VSB-AM) signals using 8-level symbol coding will be used for terrestrial broadcasting of DTV signals within the United States. These VSB-AM signals have their natural carrier wave, which would vary in amplitude depending on the percentage of modulation, replaced by a pilot carrier wave of fixed amplitude, which amplitude corresponds to a prescribed percentage of modulation. This percentage modulation is in specified ratio with the smallest change in symbol code level, so detection of the amplitude of the pilot carrier wave provides a good basis for developing AGC signals for the radio receiver when VSB-AM signals are being received. The pilot carrier is offset in frequency from the middle of the final IF amplifier passband, so the pilot carrier frequency differs from the natural ringing frequency of the final IF amplifier filter when it is stimulated by impulse noise. The pilot carrier can be separated from the synchronously detected digital signal using a very narrowband finite-impulse-response (FIR) digital filter which rejects response to the natural ringing frequency of the final IF amplifier filter. So, an AGC signal resulting from amplitude detection of a narrowband FIR filter can be made to control the gain of the IF amplifiers of the radio receiver with sufficient rapidity and accuracy of gain control as to implement "soft" digital symbol decoding, without need for further gain control after synchronous detection of the VSB amplitude modulation. Dr. Chandralcant B. Patel and the inventor have described such AGC systems in their allowed U.S. patent application Ser. No. 08/573,454 filed 15 Dec. 1995, entitled AUTOMATIC GAIN CONTROL OF RADIO RECEIVER FOR RECEIVING DIGITAL HIGH-DEFINITION TELEVISION SIGNALS, and incorporated herein by reference. These AGC signals, which have a time constant that is of the order of tens of data symbols, are referred to as "fast" AGC signals. AGC responding within a time period in which no more than a hundred QAM symbols or so are received is considered to have a "fast" response in a DTV receiver.

It is also desirable to apply "fast" AGC signals to suppressed-carrier quadrature-amplitude-modulation (QAM) signals, to implement "soft" digital symbol decoding, without need for further gain control after synchronous detection of the QAM modulation. The QAM signals have suppressed carriers, which are located in the middle of the passband of the IF amplifiers at frequencies substantially corresponding to the natural ringing frequencies of the IF amplifier filters when they are stimulated by impulse noise. This causes significant problems in detecting the actual amplitude of QAM signals when developing AGC signals for QAM radio receivers, particularly as the number of coding states is increased. T. M. Wagner et alii in U.S. Pat. No. 5,235,424 issued 10 Aug. 1993, entitled AUTOMATIC GAIN CONTROL SYSTEM FOR A HIGH DEFINITION TELEVISION RECEIVER, and incorporated herein by reference describe taldng the square root of the sums of the squares of the real and imaginary samples of the QAM signals to develop AGC signals. In effect this is a digital method for detecting the envelope of the QAM signal. The problem with this approach is that when the tuned circuits associated with the IF amplifiers ring at their natural frequency in response to stimulation by impulse noise, the envelope of the QAM signal is increased in amplitude, causing the AGC to reduce the radio receiver gain. If one attempts to implement "soft" digital symbol decoding with just the IF amplifier AGC (as possibly augmented by RF amplifier AGC), the reduction in gain for the QAM signal causes errors in the digital symbol decoding that persist for the duration of the ringing period even though the IF amplifiers do not exhibit clipping over that entire time. The reduction of the radio receiver gain caused by the AGC responding to impulse noise compresses the differences between adjacent QAM modulation levels.

The ringing of the tuned circuits associated with the IF amplifiers at their natural frequency when stimulated by impulse noise also causes a low-frequency transient that shifts the boundaries between symbol levels, to cause errors in symbol decoding. This problem cannot be overcome by the application of AGC since it is not a problem of gain being incorrect, but is instead a problem with shift in direct bias.

The inventor suggests that these problems be overcome or at least mitigated by suppressing the response to the midband ringing of the tuned circuits associated with the IF amplifiers. The symbol coding of QAM signals used in television is randomized in order that carrier suppression obtains. Most of the intelligence in the QAM signals is therefore contained in sidebands at some remove from the carrier frequency in the lower-frequency and upper-frequency reaches of the passbaiid. This permits the separation of the intelligence from the natural frequency ringing, which is in the central portion of the passband.

The removal of any ringing energy at natural frequency in the central portion of the passband must be done by methods that employ phase cancellation, rather than by methods that employ resonant effects which would simply lead to relocation of the natural frequencies. That is, one prefers not merely to shift the energy associated with resonances in the IF amplifier tuned circuitry to new frequencies, but rather to remove that energy from the system by destructive cancellation.

SUMMARY OF THE INVENTION

A gain-controlled radio receiver for receiving quadrature-amplitude-modulated radio-frequency signals susceptible to being accompanied by impulse noise, which radio receiver embodies the invention, generally comprises the following elements. A frequency-selective amplifier supplies an amplified response to the QAM radio-frequency signals and has a midband resonance stimulated by impulse noise that accompanies those QAM radio-frequency signals from time to time, which impulse noise causes the amplified response to exhibit undesirable ringing. Non-resonant filter circuitry of a phase reinforcement and cancellation type provides a selective response to the QAM components of the amplified response as separated from at least a portion of the undesirable ringing. Automatic gain control circuitry controls the gain of the gain-controlled radio receiver in response to the selective response to the QAM components of the amplified response as separated by the non-resonant filter circuitry from undesirable ringing. Preferably, the automatic gain control exhibits a "fast" response responding within a time period in which no more than a hundred QAM symbols or so are received. The non-resonant filter circuitry of phase reinforcement and cancellation type can be finite-impulse-response (FIR) digital filtering for digitized signal generated from the QAM radio-frequency signal, for example.

In one of certain radio receivers for receiving QAM radio-frequency signals, which embody the invention in one aspect thereof, the final IF amplifier is designed with a passband low enough in frequency that its response can be digitized, and the energy associated with resonances in the IF amplifier tuned circuitry are then removed by band-reject digital filtering of the digitized final-IF-amplifier response before using synchrodyning procedures to translate the final-IF signal to baseband. The band-reject digital filter is a finite-impulse-response (FIR) filter having linear phase response and consequently having uniform group delay.

In other radio receivers for receiving QAM radio-frequency signals, which embody the invention in different form, removal of the energy associated with resonances in the IF amplifier tuned circuitry by destructive cancellation is done after shifting that energy to baseband by synchronous detection procedures. In one type of these radio receivers the real response of the in-phase synchronous detector and the imaginary response of the quadrature-phase synchronous detector are each highpass filtered using respective linear-phase FIR filters of similar construction. Thereafter, the sum of the squares of the real and imaginary samples of the QAM signals (or the square root of that sum) can be calculated as a basis for developing "fast" AGC signals.

In other types of QAM radio receivers, in which destructive cancellation of the energy associated with resonances in the IF amplifier tuned circuitry is done after shifting that energy to baseband by synchronous detection procedures, the real response of the in-phase synchronous detector or the imaginary response of the quadrature-phase synchronous detector is subjected to digital differentiation. The differentiated response is then subjected to digital integration, to recover the synchronous detector response freed from an accompanying low-frequency component attributable to ringing in the IF amplifier tuned circuitry. The absolute value of this digital integration result is a rectified synchronous detection response, which is then pealk detected to develop indications of QAM carrier strength used to AGC the QAM radio receiver.

In the block schematic diagrams, clock or control signal connections are shown in dashed line, where it is desired to distinguish them from connections for the signals being controlled. To avoid overcomplexity in the block schematic diagrams, some shimming delays necessary in the digital circuitry are omitted, where a need for such shimming delay is normally talcen into account by a circuit or system designer.

DETAILED DESCRIPTION OF THE PREFERRED EMBODIMENTS

Figure 1:
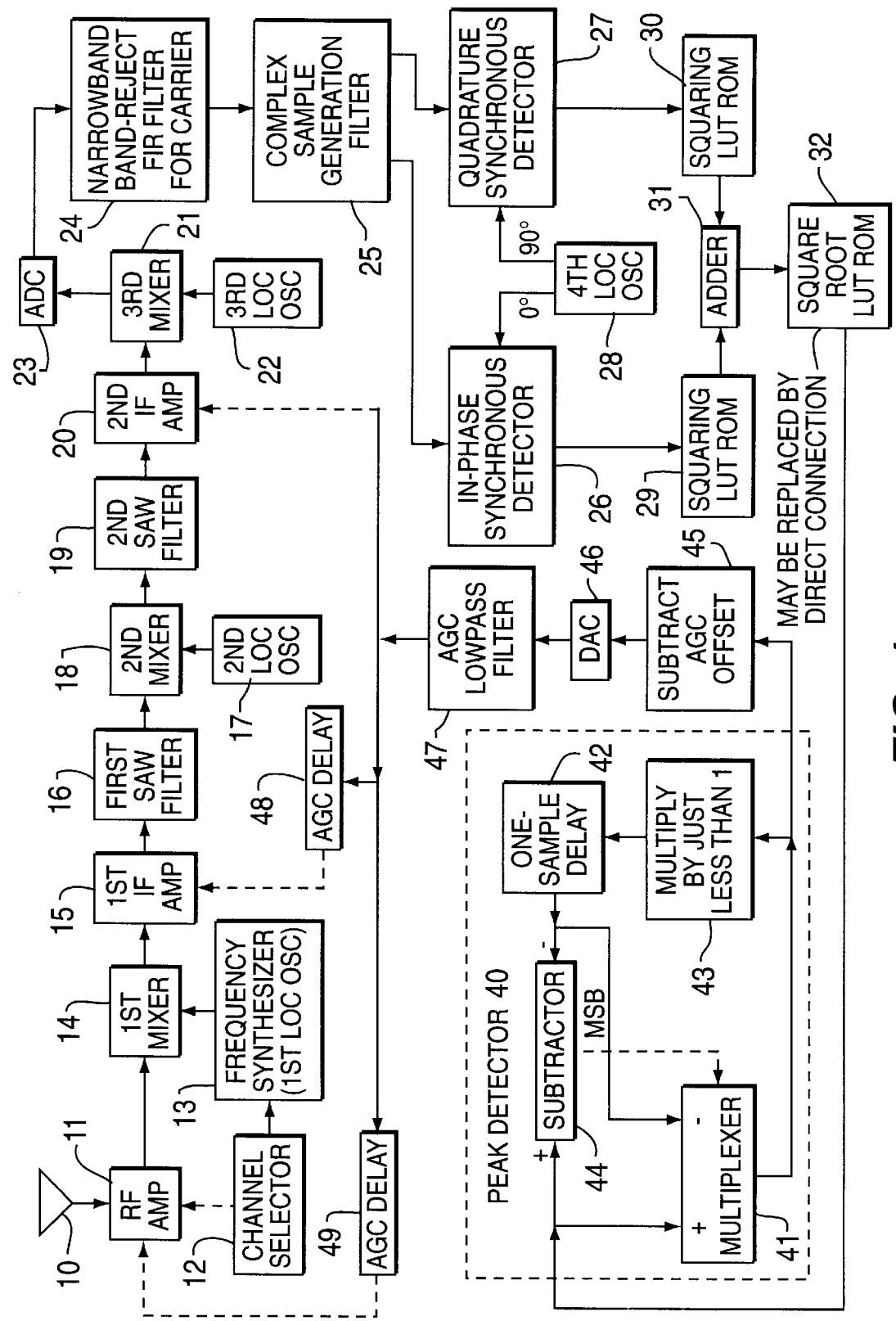
FIG. 1 is a block schematic diagram of the portions of a QAM radio receiver with AGC, which radio receiver in accordance with an aspect of the invention uses a narrowband band-reject FIR filter after its final IF amplifier for suppressing ringing induced by impulse noise.

FIG. 1 shows portions of a QAM radio receiver with AGC including elements 10–21 that select one of channels at different locations in the frequency band for DTV signals and perform plural frequency conversion of the selected channel to a final intermediate-frequency signal in a final intermediate-frequency band. FIG. 1 shows a broadcast receiving antenna 10 arranged to capture DTV signals for application to a radio-frequency amplifier 11 as input signal. Alternatively, the radio-frequency amplifier 11 can be connected for receiving D receiving antenna or from a cablecast transmission system.

More particularly, in the FIG. 1 portions of a QAM radio receiver, a channel selector 12 designed for operation by a human being tunes the RF amplifier 11 and determines the frequency of first local oscillations that a frequency synthesizer 13, which functions as a first local oscillator, furnishes to a first mixer 14 for heterodyning with DTV signals amplified by the RF amplifier 11. The RF amplifier 11 is usually quite broadly tuned; and in some QAM radio receivers no RF amplifier is used, the first mixer 14 upconverting the DTV signals as supplied from the antenna 10 or an alternative source. The first mixer 14 upconverts the received signals in the selected channel to prescribed first intermediate frequencies (e.g., with 920 MHz carrier) and customarily includes an LC filter in its output circuit that suppresses the unwanted image frequencies that would otherwise accompany the upconversion result the first mixer 14 supplies. The first intermediate-frequency signal resulting from the upconversion is applied as the input signal to a first intermediate-frequency amplifier 15, which supplies amplified first IF signal for driving a first surface-acoustic-wave (SAW) filter 16. The upconversion to the rather high-frequency first intermediate frequencies facilitates the SAW filter 16 having a large number of poles and zeroes. Second local oscillations from a second local oscillator 17 are supplied to a second mixer 18 for heterodyning with the response of the first SAW filter 16, to generate second intermediate frequencies (e. g., with 44 MHz carrier). A second SAW filter 19 is used for rejecting the unwanted image frequencies that accompany the downconversion result supplied from the second mixer 18. The second SAW filter 19 may include traps for sound and video carriers of adjacent-channel NTSC television transmissions in a receiver for VSB-AM DTV signals, but such traps are better omitted in a receiver for QAM DTV signals. The second IF signal supplied as the response of the second SAW filter 19 is applied as input signal to a second intermediate-frequency amplifier 20, which generates an amplified second IF signal response to its input signal. Oscillations from a third local oscillator 21 are heterodyned with the amplified second IF signal response in a third mixer 22, which mixer customarily includes an LC filter in its output circuit that suppresses the unwanted image frequencies that would otherwise accompany the third IF signal response that the third mixer 22 supplies as its downconversion result. The third and final IF signal supplied by the third mixer 22 occupies a frequency band 6 MHz wide, the lowest frequency of which is above zero frequency.

The third IF signal response is supplied to a subsequent analog-to-digital converter (ADC) 23 for digitization. The ADC 23 is preferably a "flash converter" with 10-bit or so resolution. The lowpass analog filtering of the third mixer 22 response done in the ADC 23 as a preliminary step in analog-to-digital conversion suppresses the image frequencies of the third intermediate frequencies, and the second SAW filter 19 has already restricted the bandwidth of the third intermediate-frequency signals presented to the ADC 23 to be digitized; so the ADC 23 functions as a bandpass analog-to-digital converter.

The sampling of the lowpass analog filter response in the ADC 23 as the next step in analog-to-digital conversion is done responsive to pulses in a first clock signal supplied from a sample clock generator that is not explicitly shown in FIG. 1. One method for generating the first clock signal is described in U.S. Pat. No. 5,508,755. The sample clock generator preferably includes a crystal oscillator capable of frequency control over a relatively narrow range for generating cissoidal oscillations at a multiple of symbol rate. A symmetrical clipper or limiter generates a square-wave response to these cissoidal oscillations to generate the first clock signal, which the ADC uses to time the sampling of the final IF signal after filtering to limit bandwidth. The frequency of the cissoidal oscillations generated by the crystal oscillator in the sample clock generator can be determined by an automatic frequency and phase control (AFPC) signal developed in response to symbol frequency components of the received DTV signal, for example, as described in in U.S. Pat. No. 5,506,636. The pulses in the first clock signal recur at four times the symbol rate for the QAM signals.

The 6 MHz wide passband for the third IF signal is kept quite low in frequency—e. g., 2–8 MHz—so analog-to-digital conversion by the ADC 23 can be done at acceptably low rates while sampling that final IF signal sufficiently above Nyquist rate to implement a narrowband band-reject filter 24 that follows the ADC 23 and suppresses energy near the QAM carrier. As noted earlier in this specification, such energy near the QAM carrier results from ringing of resonant circuitry in the IF amplifier chain. The narrowband band-reject filter 24 can be constructed by modifying a narrowband bandpass finite-impulse-response (FIR) filter having a bandwidth equal to the desired rejection band and having a kernel with an odd number of tap weights and with the symmetry of the tap weights required for linear phase response. All the tap weights except the one at the center of the kernel are modified by multiplying by minus one, and the amplitude of the tap weight at the center of the kernel respective to the amplitudes of the other tap weights is adjusted (if necessary) so that the modified filter provides no response at zero frequency. The bandwidth of the desired rejection band is chosen narrow enough not to reduce appreciably the QAM sideband energy containing data, but wide enough to suppress changing ringing energy near QAM carrier. The nairowband band-reject filter 24 is a linear-phase FIR digital filter and consequently exhibits uniform group delay.

In a QAM transmitter randomization of error corrected data is done so as to suppress energy in the modulating signals that is below an arbitrarily prescribed frequency. The narrow band over which rejection is to be provided by the narrowband band-reject filter 24 extends over a frequency range where the energy in the QAM signal is suppressed by the randomization of the error corrected data.

The ADC 23 supplies digital samples of 10-bit or so resolution responsive to the samples of the band-limited final IF signal, which digital samples are filtered by the band-reject FIR digital filter 24 to remove ringing energy near the carrier. The resulting linear-phase digital sample response of the digital filter 24 is converted by complex digital sample generation filter 25 to complex digital samples that are used by an in-phase digital synchronous detector 26 and a quadrature-phase digital synchronous detector 27 in the synchrodyning of the QAM signals to baseband. By way of example, the filter 25 can comprise a Hilbert transform filter for generating imaginary digital samples from the digital filter 24 response and delay for generating real digital samples from the digital filter 24 response, which delay compensates for the latency of the Hilbert transform filter. Sampling well above Nyquist rate with the ADC 23 maintains uniformity of responses from the digital synchronous detectors 26 and 27 despite phase slippage between the complex digital samples from the complex digital sample generation filter 25 and the complex carrier signal used to synchronously detect those complex digital samples.

Other arrangements for the filter 25 are known. C. M. Rader in his article "A Simple Method for Sampling In-Phase and Quadrature Components", IEEE TRANSACTIONS ON AEROSPACE AND ELECTRONIC SYSTEMS, Vol. AES-20, No. 6 (Nov. 1984), pp. 821–824, describes replacing the Hilbert-transform FIR filter and the compensating-delay FIR filter of Rice and Wu with a pair of IIR all-pass digital filters designed based on Jacobian elliptic functions and exhibiting a constant $\pi/2$ difference in phase response for digitized bandpass signals. T. F. S. Ng in United Kingdom patent application 2 244 410 A published 27 Nov. 1991 and entitled QUADRATURE DEMODULATOR describes the use of FIR digital filters, rather than IIR filters as described by Rader, for developing a constant $\pi/2$ difference in phase between a real response Re and an imaginary response Im to digitized bandpass signals. U.S. Pat. No. 5,508,755 describes still further arrangements.

The digital synchronous detectors 26 and 27 receive in-phase (0°) and quadrature-phase (90°) carriers respectively from a fourth local oscillator 28, which has automatic frequency and phase control (AFPC) furnished by means not shown in FIG. 1. By way of example, AFPC signal may be developed using a variant of the well-known Costas loop, multiplying the responses of the digital synchronous detectors 26 and 27 together and lowpass filtering the resulting product, as described in U.S. Pat. No. 5,506,636.

Other portions of a QAM receiver for receiving DTV signals, which portions are used to recover the data in the responses of the digital synchronous detectors 26 and 27 are omitted from FIG. 1 because they have no direct bearing on the receiver AGC to which the present invention is directed. The digital synchronous detectors 26 and 27 supply in parallel to a symbol de-interleaver a stream of real samples and a stream of imaginary samples descriptive of the QAM modulating signal. The de-interleaved QAM synchrodyne-to-baseband result supplied from the de-interleaver is resampled in response to a second clock signal from the sample clock generator in decimation circuitry, to reduce the sample rate of complex baseband response down to twice the QAM symbol rate and thus reduce the hardware requirements on an equalizer. This amplitude-and-group-delay equalizer converts a baseband response with an amplitude-versus-frequency characteristic that tends to cause inter-symbol error to a more optimum amplitude-versus-frequency characteristic that minimizes the likelihood of inter-symbol error. The response of the amplitude-and-group-delay equalizer is applied as input signal to a two-dimensional trellis decoder, which performs the symbol decoding that recovers a digital data stream from a QAM-origin signal. This data stream is supplied to a data de-interleaver. The de-interleaved data is applied to a Reed-Solomon decoder. Error-corrected data are supplied from the Reed-Solomon decoder to a data de-randomizer, which regenerates packets of data for a packet sorter. The packet sorter sorts packets of data for different applications, responsive to header codes in the successive packets of data. Packets of data descriptive of the audio portions of the DTV program are applied by the packet sorter to a digital sound decoder. The digital sound decoder supplies left-channel and right-chaiinel stereophonic sound signals to a plural-channel audio amplifier that drives a plurality of loudspealkers. Packets of data descriptive of the video portions of the DTV program are applied by the packet sorter to an MPEG-2 decoder. The MPEG-2 decoder supplies synchronizing signals for the video reproduction apparatus, as well as signals descriptive of the red, green and blue components of the image to be displayed on a viewing screen of the video reproduction apparatus.

AGC is developed in the remaining portions of the QAM receiver shown in FIG. 1. The responses of the digital synchronous detectors 26 and 27 are squared and summed, and the sum is square-rooted to generate an indication of the envelope of the QAM signal, separated from the energy associated with resonances in the IF amplifier tuned circuitry ringing in response to stimulation by impulse noise. FIG. 1 shows the squaring of the responses of the digital synchronous detectors 26 and 27 being done using look-up tables of squares stored in read-only memories (ROMs) 29 and 30, respectively. Alternately, time-division-multiplexed use of a single look-up tables of squares in one ROM could be used to generate the squared responses of the digital synchronous detectors 26 and 27. FIG. 1 shows the squared responses of the digital synchronous detectors 26 and 27 being summed by a digital adder 31. The sum from the digital adder 31 is square-rooted using a look-up table of square roots stored in a read-only memory 32. Squaring of the responses of the digital synchronous detectors 26 and 27 preferably is done using look-up tables in ROM, because the indication of the envelope of the QAM signal is generated more quickly than by other digital multiplication techniques, better to implement fast AGC. At the cost of larger ROM, the generation of signal descriptive of the envelope of the QAM signal can be achieved still a bit faster by processing the responses of the digital synchronous detectors 26 and 27 completely with a more complicated look-up table in ROM addressed by the side-by-side responses of the digital synchronous detectors 26 and 27.

FIG. 1 shows a digital peak detector 40 responding to the indication the ROM 32 supplies of the envelope of the QAM signal, separated from the energy associated with resonances in the IF amplifier tuned circuitry ringing in response to stimulation by impulse noise, which indication is received by the digital peak detector 40 as its input signal. A multiplexer 41 in the digital peak detector 40 is arranged to select the current sample of its input signal as the current sample of its output signal, providing the cturent sample of its input signal exceeds the response of a one-sample-delay circuit 42, which circuit 42 is typically a clocked latch. The one-sample-delay circuit 42 delays the previous sample of the digital peak detector 40 output signal, as decremented slightly by a decrementing circuit 43. The comparison of the slightly decremented previous sample of the detector 40 output signal supplied from the one-sample-delay circuit 42 with the current sample of the detector 40 input signal is done by a two's complement subtractor 44, with the most-significant (sign) bit of the difference being supplied to the multiplexer 41 as its control signal.

The decrementor 43 can be a shift-and-subtract circuit for multiplying the previous sample of the digital peak detector 40 output signal by a factor slightly less than unity. The decrementor 43 is necessary so that the digital peak detector 40 response can follow the slow decay of the envelope of the QAM signal occasioned by the transmission path between the QAM transmitter and receiver changing characteristic. The amount of decrementation must be kept small enough that the digital peak detector 40 response does not decay too much between the times that the QAM signal is at one of its maximum modulation levels. In more sophisticated designs the decrementation factor can be altered in response to changing noise conditions. The occurrence of strong impulse noise or precipitous fading can be detected; and, after that occurence subsides, the decrementation factor in the digital peak detector 40 can be briefly increased to lessen the possibility of AGC set-up that may "lock-out" the QAM receiver.

FIG. 1 shows the subtraction of an AGC offset being done in the digital regime by a digital subtractor 45, which receives the digital peak detector 40 response as minuend and has a wired AGC offset as subtrahend. The difference output signal from the subtractor 45 is converted to analog AGC signal by a digital-to-analog converter 46. The analog AGC signal from the DAC 46 is filtered by an analog lowpass filter 47 to provide a smoothly varying fast AGC. FIG. 1 shows the smoothly varying fast AGC response of the filter 47 being applied directly without delay to the second IF amplifier 20, being applied to the first IF amplifier 15 with AGC delay provided by the AGC delay circuit 48, and being applied to the RF amplifier 11 with AGC delay provided by the AGC delay circuit 49. The mechanics of applying delayed AGC are carried out in accordance with conventional practice as familiar in the radio receivers used in the analog television alt, despite the AGC time constant being considerably faster in the QAM radio receiver and the AGC being tighter than that preferred in commercial analog television receivers. In commercial analog television receivers the preference is to reduce final (video) detector response somewhat for weaker signals, to reduce the likelihood of display overload in the presence of expectedly stronger noise. In DTV receivers final detector response (of synchronous detectors 26 and 27) is maintained as constant as possible with weakening signal strength, so modulation levels descriptive of symbol code values change less and place less burden on the symbol decoding apparatus.

In U.S. patent application Ser. No. 08/825,170 filed 19 Mar. 1997 and entitled DIGITAL TELEVISION RECEIVERS THAT DIGITIZE FINAL I-F SIGNALS RESULTING FROM TRIPLE-CONVERSION, Dr. Chandrakant B. Patel and the inventor describe DTV receivers in which the AGC delay circuit 48 is dispensed with, the first IF amplifier 15 operative at ultra-high frequencies is provided with fixed gain sufficient to overcome losses in the first SAW filter 16, and the second IF amplifier 15 operative at very high frequencies provides high gain that is AGC'd. Using fixed gain in the UHF first IF amplifier 15 makes it easier to maintain constant source impedance for driving the first SAW filter 16, better to avoid unwanted multiple reflections in the filter 16. Also, controlling gain without introducing unwanted distortions of DTV signal is easier to do at VHF.

While FIG. 1 shows AGC delays for the RF amplifier 11 and the first IF amplifier 15 being developed in the analog regime, so a single DAC 46 can be used for developing all analog AGC signals, alternatively AGC delays may be calculated in the digital regime with a respective DAC and analog AGC filter being used for developing each delayed AGC signal. While FIG. 1 shows AGC offset being developed in the digital regime, it can instead be introduced after digital-to-analog conversion. Instead of carrying out in the digital regime the peak detection of the envelope of the QAM signal, separated from the energy associated with resonances in the IF amplifier tuned circuitry ringing in response to stimulation by impulse noise, as shown in FIG. 1, the peak detection can be done in the analog regime following suitable digital-to-analog conversion. The possibility of replacing the ROM 32 by direct connection of the adder 31 output to the digital pealk detector 40 input, in order to conserve digital hardware, is indicated in FIG. 1.

Figure 2:
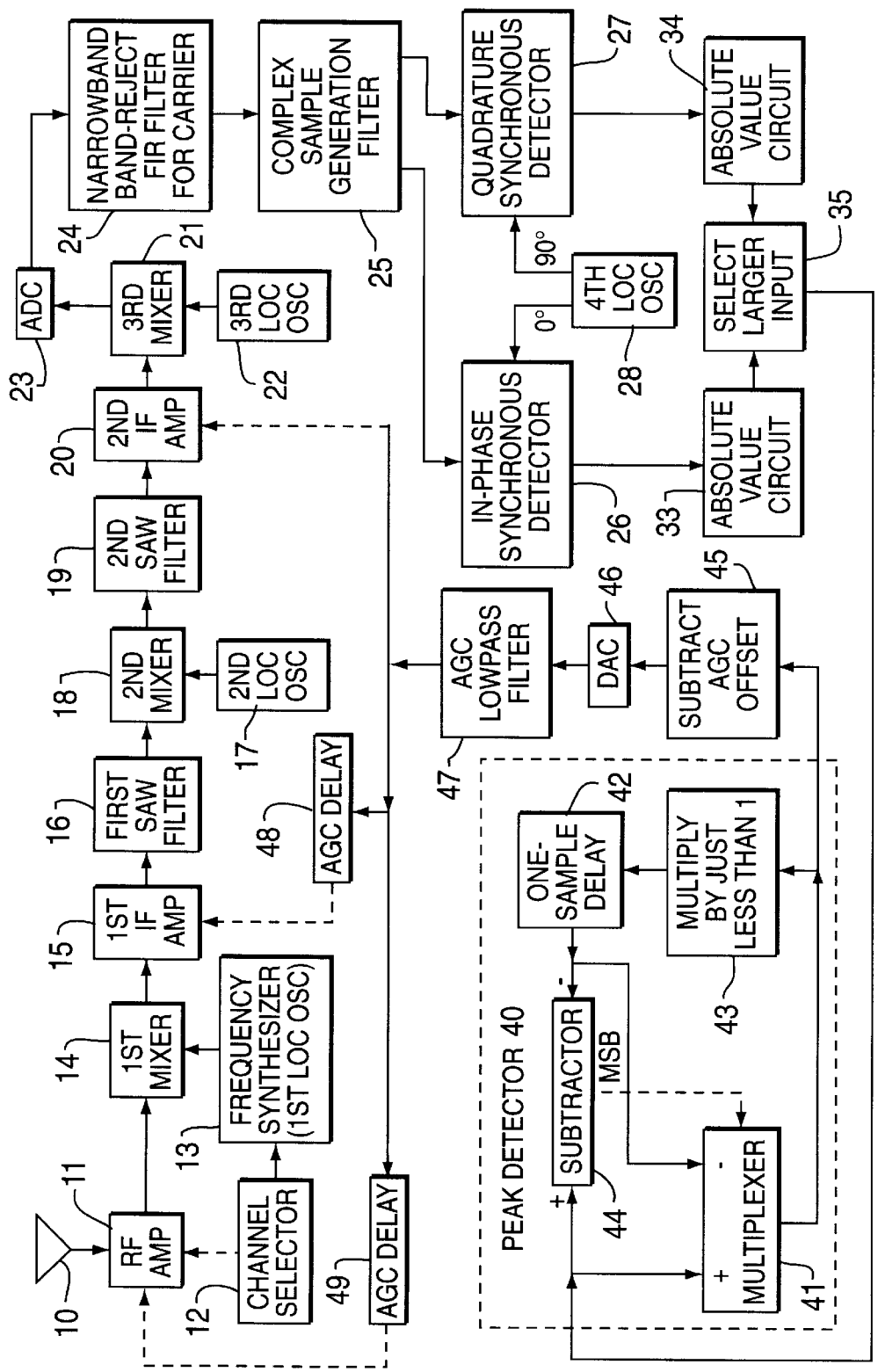
FIG. 2 is a block schematic diagram of the portions of another QAM radio receiver with AGC, which radio receiver in accordance with an aspect of the invention uses a narrowband band-reject FIR filter after its final IF amplifier for suppressing ringing induced by impulse noise.

FIG. 2 shows a modification that can be made to the FIG. 1 QAM receiver, since the carrier of the third and final IF signal should be a multiple of QAM symbol rate. In the FIG. 2 QAM receiver, AGC tends to be somewhat in error until symbol synchronization is achieved. After symbol synchronization is achieved, the selection of the larger of the absolute values of the respective responses of synchronous detectors 26 and 27 supplies input signal for the digital peak detector 40.

More particularly, the responses of synchronous detectors 26 and 27 are respectively supplied to absolute-value circuit 33 and to absolute-value circuit 34. Each absolute-value circuit may selectively one's complement the less significant bits of its two's complement input signal responsive to its most significant bit being a ONE, the resulting signal having summed therewith the most significant bit of the absolute-value circuit as shifted to least significant bit place in the addition. Alternatively, the absolute-value circuits 33 and 34 may be implemented in read-only memory. The selection of the larger of the absolute values of the respective responses of synchronous detectors 26 and 27 can be carried out with a two-input multiplexer receiving those responses as respective inputs and being controlled by the sign bit of the difference signal of a digital subtractor receiving the responses of synchronous detectors 26 and 27 as minuend and subtrahend input signals.

In a different modification of the FIG. 2 QAM receiver, the selection of the larger of the absolute values of the respective responses of the synchronous detectors 26 and 27 can be carried out within ROM addressed by the side-by-side responses of the synchronous detectors 26 and 27.

Figure 3:
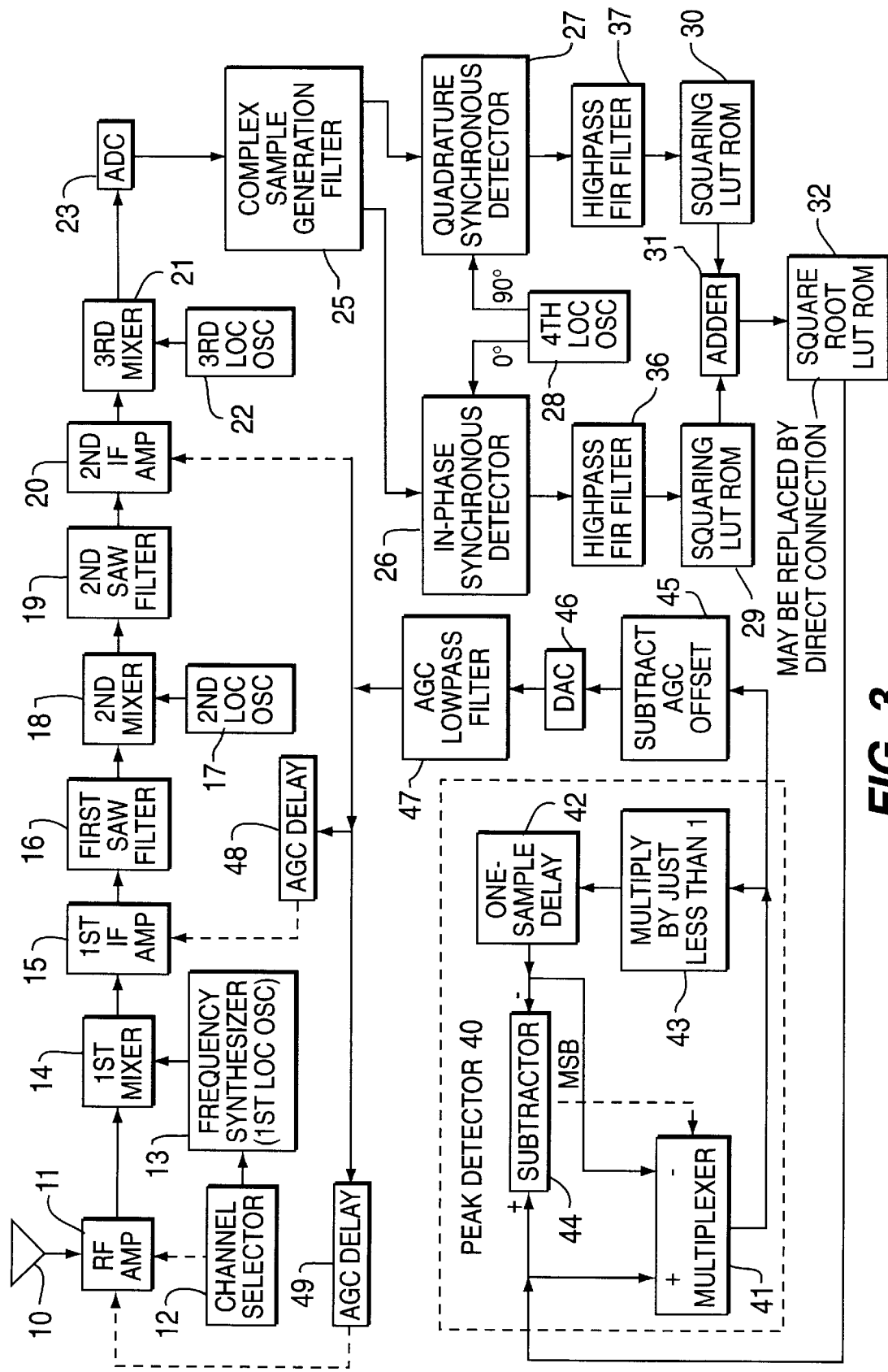
FIG. 3 is a block schematic diagram of the portions of a QAM radio receiver with AGC, which radio receiver in accordance with an aspect of the invention uses a respective highpass FIR filter after each of its in-phase and quadrature-phase synchronous detectors, for suppressing detected response to IF amplifier ringing induced by impulse noise.

FIG. 3 shows a QAM receiver that differs from the FIG. 1 QAM receiver in that the digital response of the ADC 23 is supplied directly to the complex digital sample generation filter 25, with no intervening narrowband band-reject filter 24 to suppress energy at close-to-carrier frequencies. Instead, the energy introduced by the IF amplifiers ringing in response to impulse noise is removed at baseband by highpass digital filters 36 and 37, which are both linear-phase FIR filters. The highpass digital filters 36 and 37 have substantially no response up to the arbitrarily prescribed frequency in which energy in the QAM modulating signals is suppressed by data randomization. The highpass digital filter 36 is interposed between the in-phase synchronous detector 26 and the ROM 29 storing look-up tables for squaring the response of synchronous detector 26. The highpass digital filter 37 is interposed between the quadrature-phase synchronous detector 27 and the ROM 30 storing look-up tables for squaring the response of synchronous detector 27.

Figure 4:
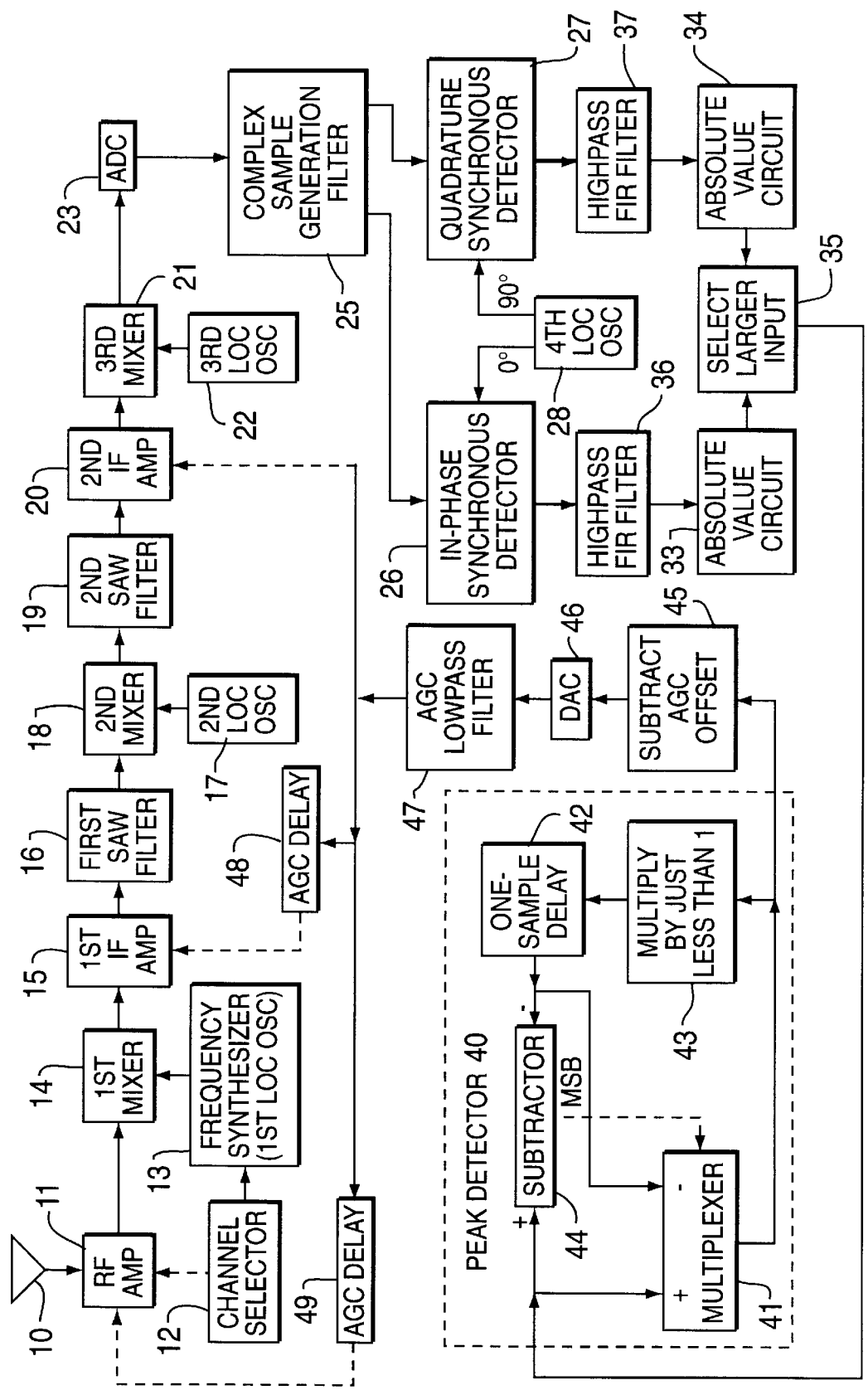
FIG. 4 is a block schematic diagram of the portions of another QAM radio receiver with AGC, which radio receiver in accordance with an aspect of the invention uses a respective highpass FIR filter after each of its in-phase and quadrature-phase synchronous detectors, for suppressing detected response to IF amplifier ringing induced by impulse noise.

FIG. 4 shows a QAM receiver that differs from the FIG. 2 QAM receiver in that the digital response of the ADC 23 is supplied directly to the complex digital sample generation filter 25, with no intervening narrowband band-reject filter 24 to suppress energy at close-to-carrier frequencies. Instead, the energy introduced by the IF amplifiers ringing in response to impulse noise is removed at baseband by highpass digital filters 36 and 37, which are both linear-phase FIR filters. The highpass digital filter 36 is interposed between the in-phase synchronous detector 26 and the absolute-value circuit 33. The highpass digital filter 37 is interposed between the quadrature-phase synchronous detector 27 and the absolute-value circuit 34.

Figure 5:
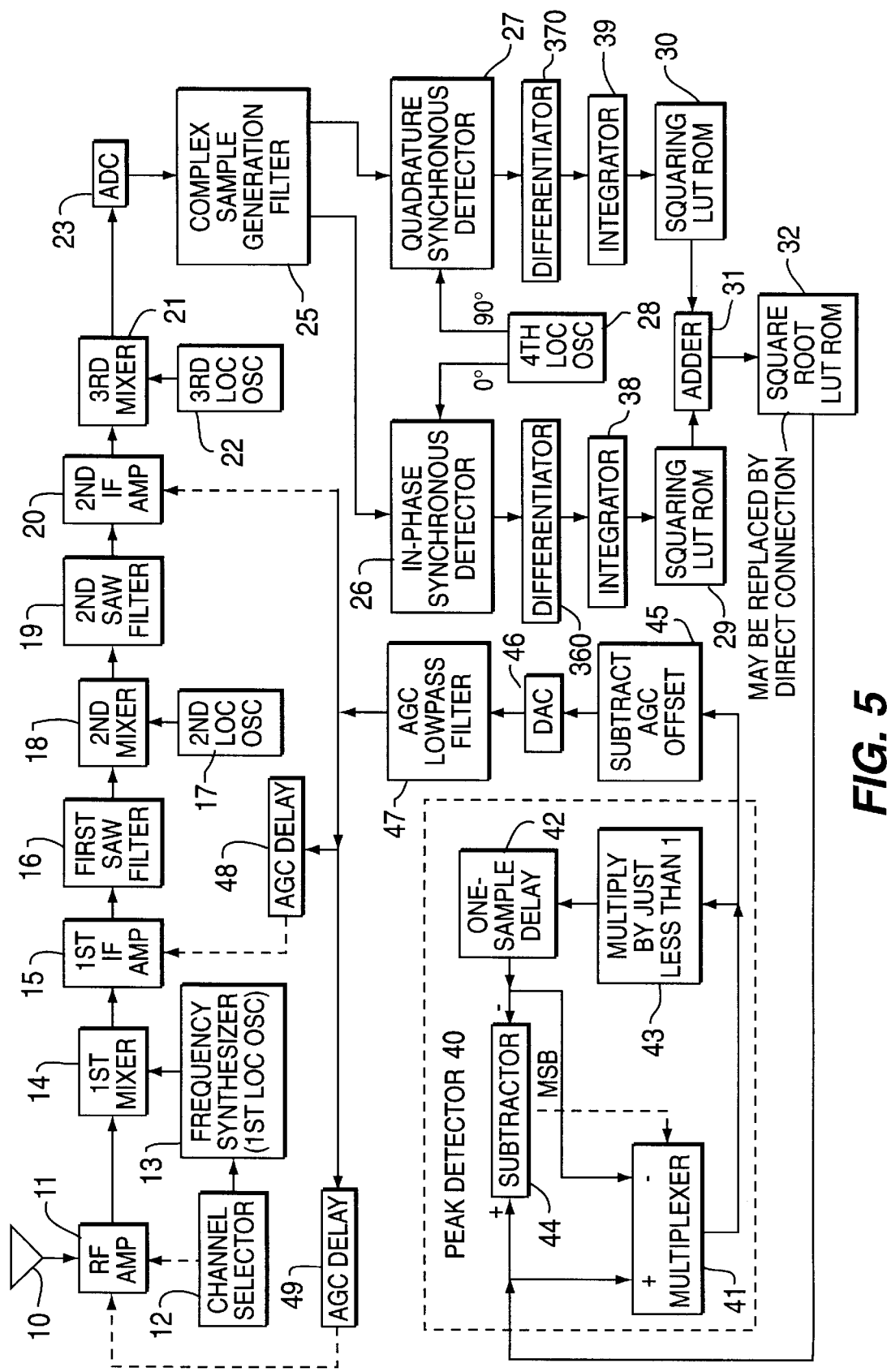
FIG. 5 is a block schematic diagram of the portions of a QAM radio receiver with AGC, which radio receiver in accordance with an aspect of the invention uses a respective cascade of digital differentiator and digital integrator after each of its in-phase and quadrature-phase synchronous detectors, for suppressing detected response to IF amplifier ringing induced by impulse noise.

FIG. 5 shows a QAM receiver that like the FIG. 3 QAM receiver differs from the FIG. 1 QAM receiver in that the digital response of the ADC 23 is supplied directly to the complex digital sample generation filter 25, with no intervening narrowband band-reject filter 24 to suppress energy at close-to-carrier frequencies. In the FIG. 5 QAM receiver the energy introduced by the IF amplifiers ringing in response to impulse noise is removed at baseband by differentiating the digital response of the in-phase synchronous detector 26 with a digital differentiator 360 and by differentiating the digital response of the quadrature-phase synchronous detector 27 with a digital differentiator 370. The response of the digital differentiator 360 is reintegrated by the digital integrator 38, but without restoring the direct term, to provide in-phase synchronous detection response to QAM as addressing for the ROM 29 storing look-up tables for squaring the response of synchronous detector 26 with ringing energy removed therefrom. The response of the digital differentiator 370 is reintegrated by the digital integrator 39, but without restoring the direct term, to provide quadrature-phase synchronous detection response to QAM as addressing for the ROM 30 storing look-up tables for squaring the response of synchronous detector 27 with ringing energy removed therefrom.

Figure 6:
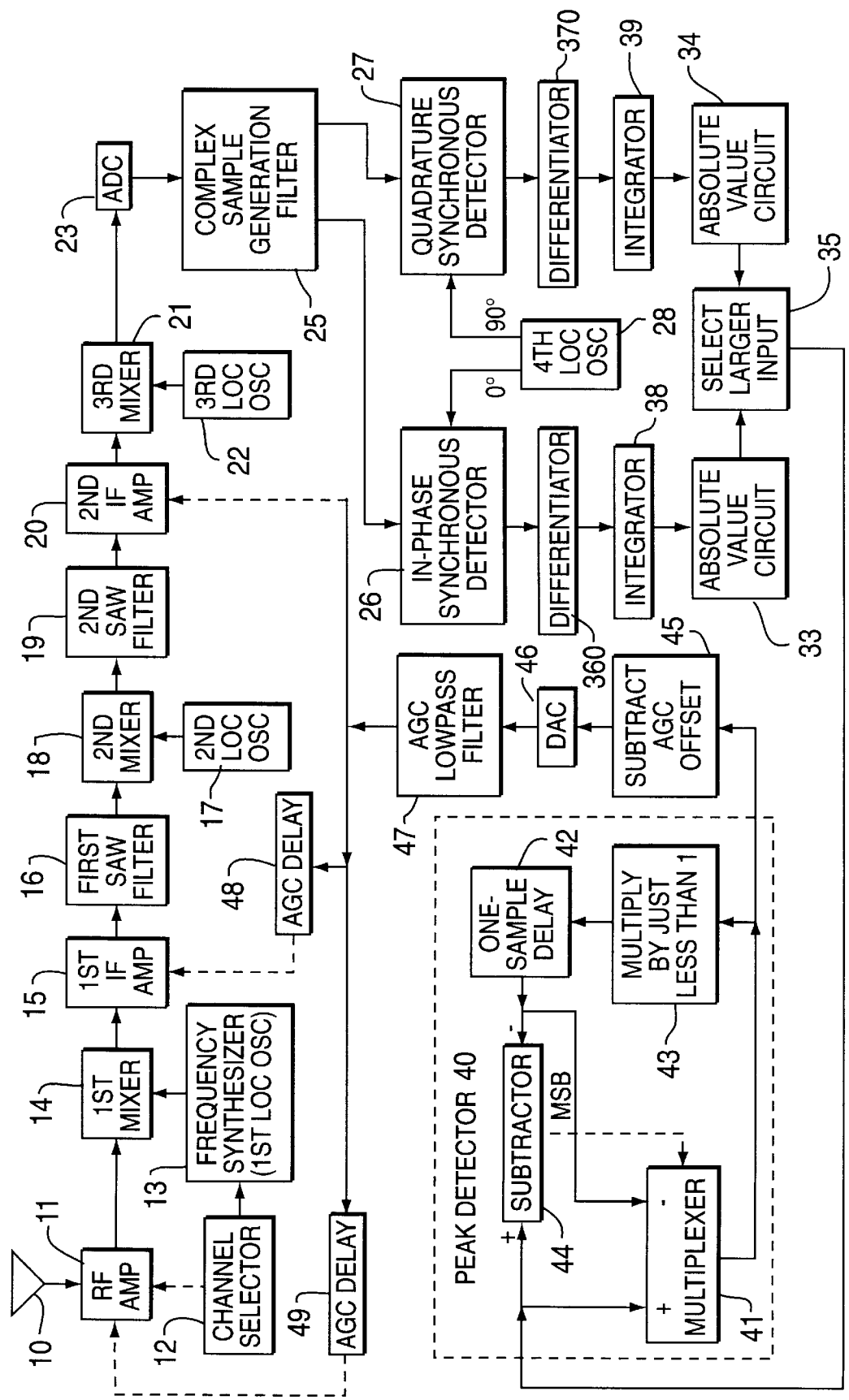
FIG. 6 is a block schematic diagram of the portions of another QAM radio receiver with AGC, which radio receiver in accordance with an aspect of the invention uses a respective highpass FIR filter after each of its in-phase and quadrature-phase synchronous detectors, for suppressing detected response to IF amplifier ringing induced by impulse noise.
Figure 7:
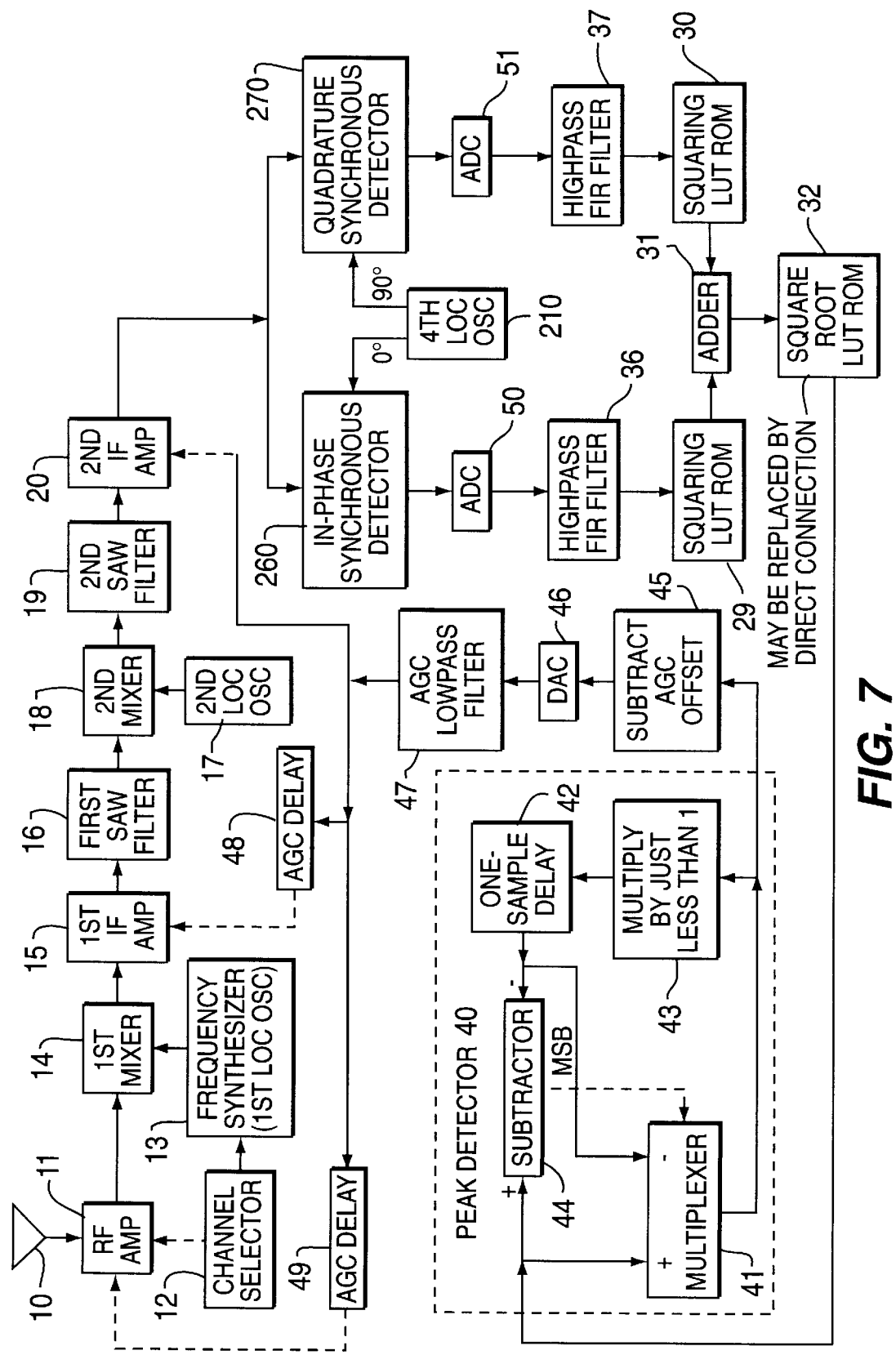
FIGS. 7, 8, 9 and 10 are block schematic diagrams of QAM receivers that embody the invention in various aspects thereof and are modifications of those QAM receivers respectively shown in FIGS. 3, 4, 5 and 6.
Figure 8:
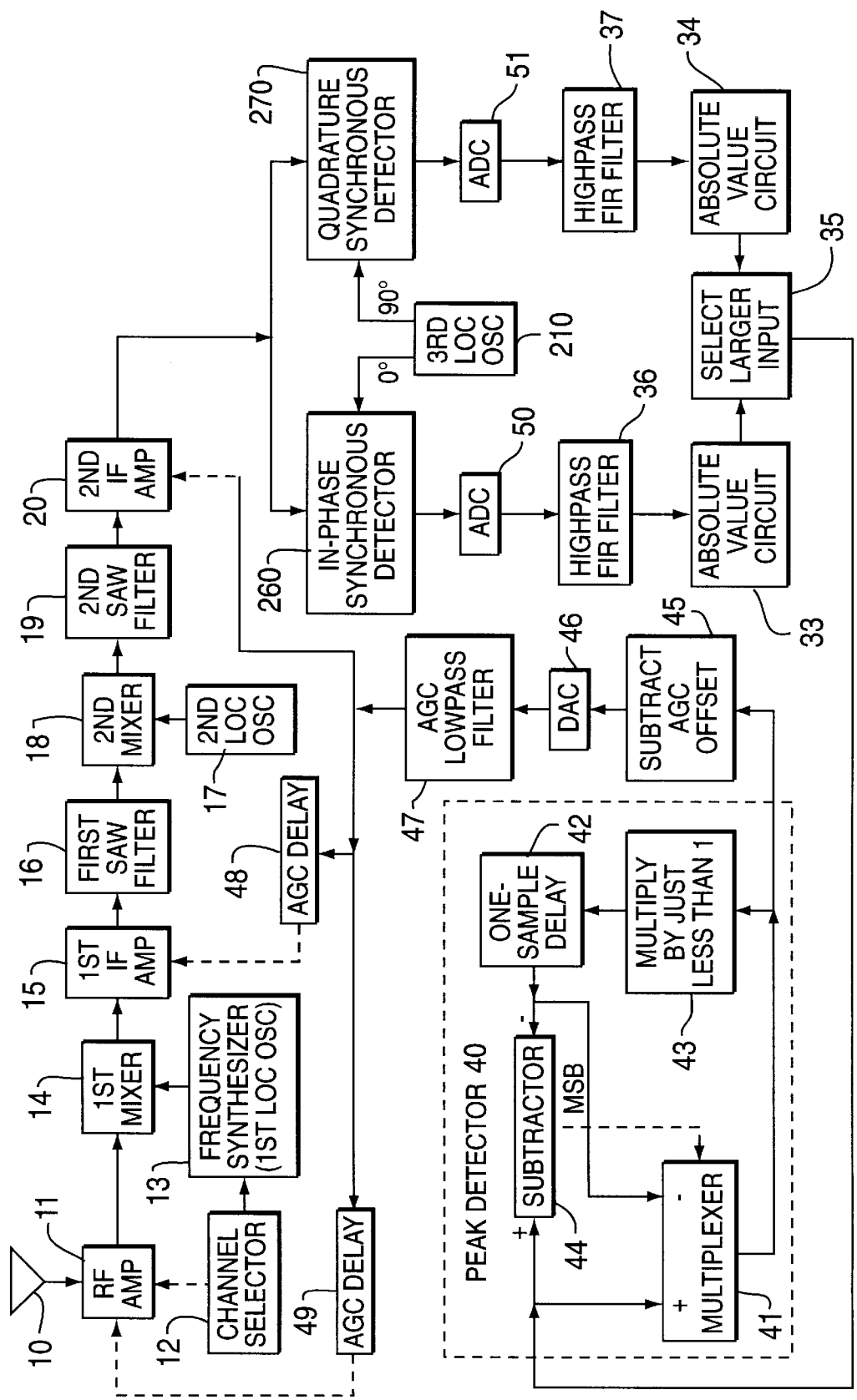
Figure 9:
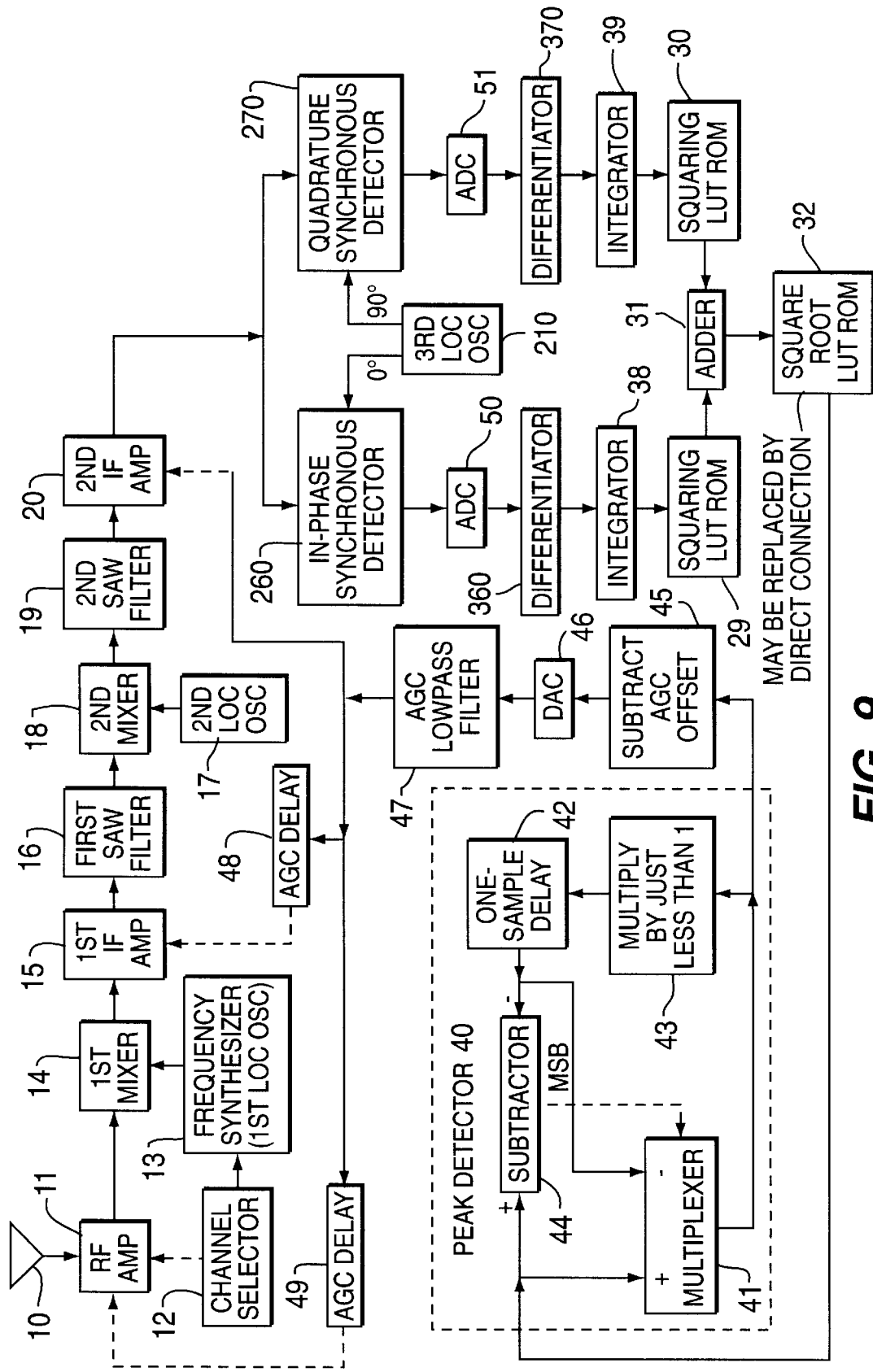
Figure 10:
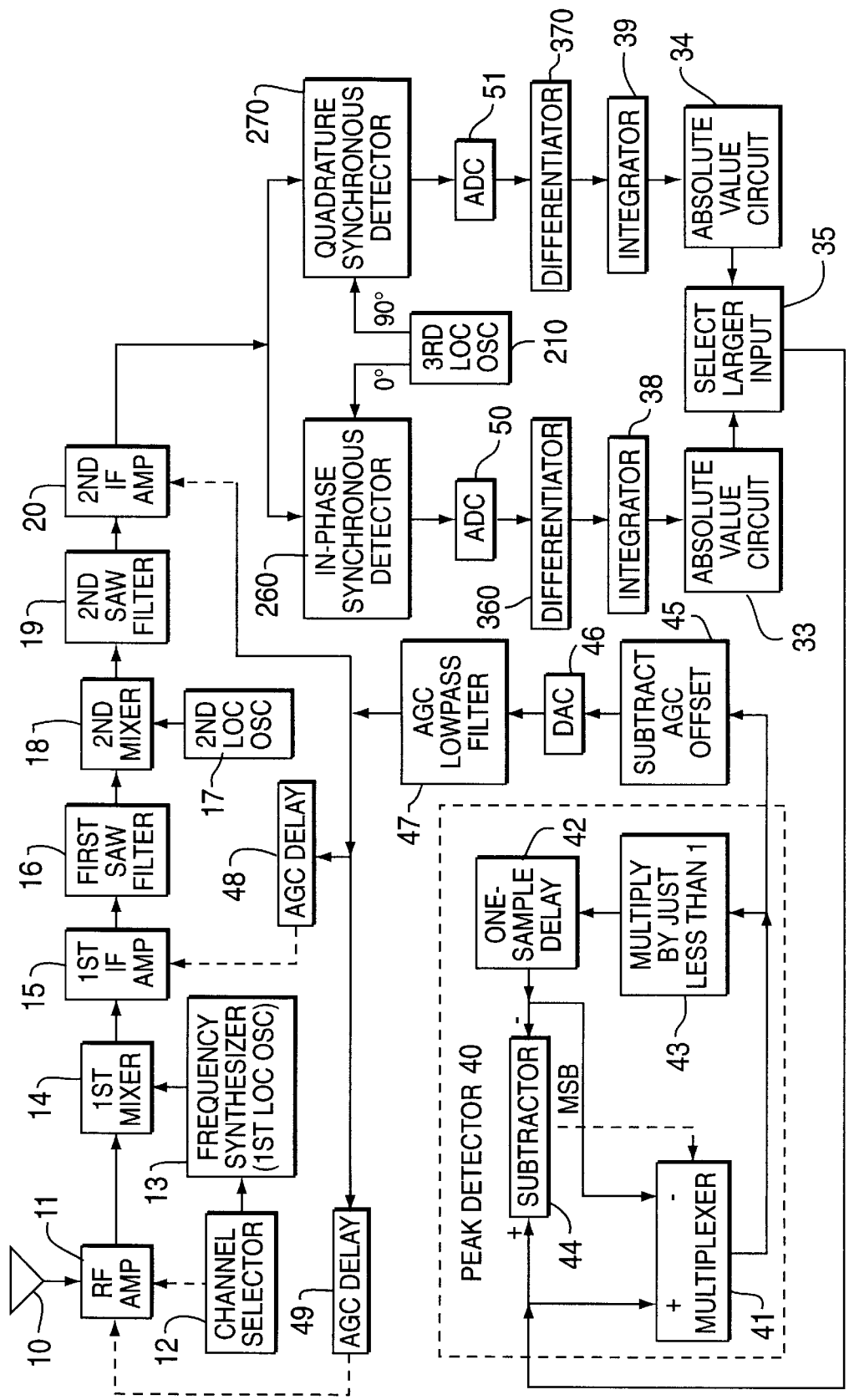

FIG. 6 shows a QAM receiver that like the FIG. 4 QAM receiver differs from the FIG. 2 QAM receiver in that the digital response of the ADC 23 is supplied directly to the complex digital sample generation filter 25, with no intervening narrowband band-reject filter 24 to suppress energy at close-to-carrier frequencies. In the FIG. 6 QAM receiver the energy introduced by the IF amplifiers ringing in response to impulse noise is removed at baseband by differentiating the digital response of the in-phase synchronous detector 26 with a digital differentiator 360 and by differentiating the digital response of the quadrature-phase synchronous detector 27 with a digital differentiator 370. The response of the digital differentiator 360 is reintegrated by the digital integrator 38, but without restoring the direct term, to provide in-phase synchronous detection response to QAM with ringing energy removed therefrom as input signal to the absolute-value circuit 33. The response of the digital differentiator 370 is reintegrated by the digital integrator 39, but without restoring the direct term, to provide quadrature-phase synchronous detection response to QAM with ringing energy removed therefrom as input signal to the absolute-value circuit 34.

Each of the QAM receivers of FIGS. 3, 4, 5 and 6 can be modified to include a narrowband band-reject filter 24 for suppressing carrier energy in the digitized final IF signal supplied to the complex digital sample generation filter 25.

FIGS. 7, 8, 9 and 10 show QAM receivers that differ from the QAM receivers of FIGS. 3, 4, 5 and 6, respectively. The differences are similar in each of the four cases. The third mixer 22 is dispensed with, and the response of the second IF amplifier 20 is applied as final IF signal to an in-phase synchronous detector 260 and to a quadrature-phase synchronous detector 270. In contrast to the in-phase synchronous detector 26 and the quadrature-phase synchronous detector 27 of the QAM receivers shown in FIGS. 3, 4, 5 and 6, the in-phase synchronous detector 260 and the quadrature-phase synchronous detector 270 of the QAM receivers shown in FIGS. 7, 8, 9 and 10 are analog synchronous detectors, rather than digital synchronous detectors. The third local oscillator 210 oscillates at the carrier frequency of the final IF signal, which is usually in the vicinity of 44 MHz. The third local oscillator 210 supplies this carrier frequency in 0° and 90° phases to the in-phase synchronous detector 260 and the quadrature-phase synchronous detector 270. The responses of the in-phase synchronous detector 260 and of the quadrature-phase synchronous detector 270 are digitized by analog-to-digital converters 50 and 51, respectively. The responses of the ADCs 50 and 51 are then utilized in the QAM receivers shown in FIGS. 7, 8, 9 and 10 in the same ways that the responses of the synchronous detectors 26 and 27 are utilized in the QAM receivers shown in FIGS. 3, 4, 5 and 6, respectively.

Figure 11:
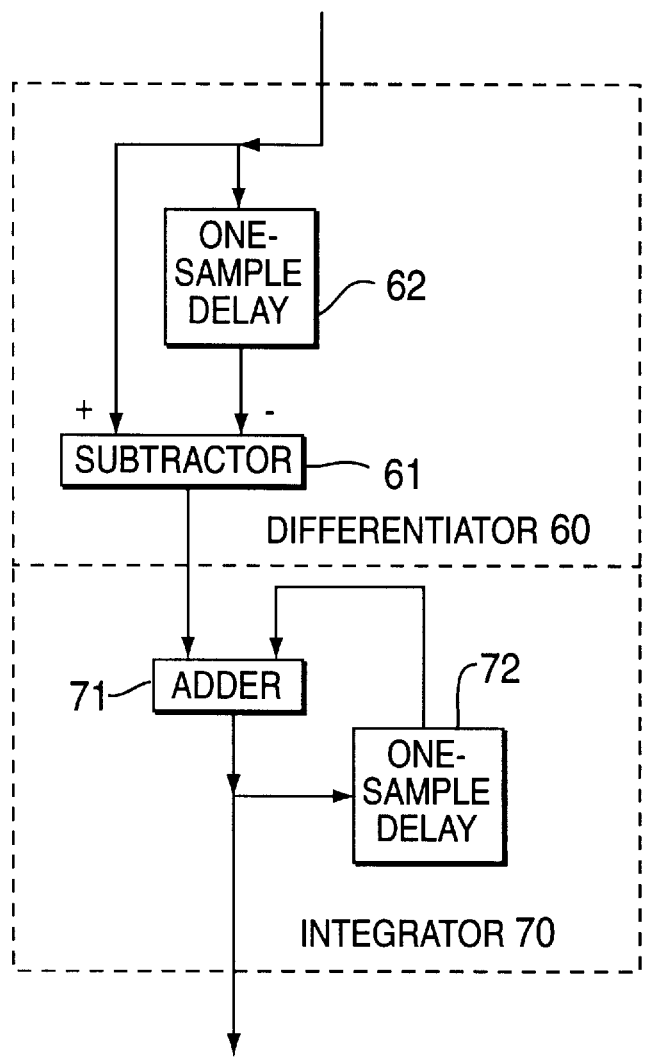
FIG. 11 is a block schematic diagram of a cascade of digital differentiator and digital integrator, as may be used in the radio receivers of FIG. 5, 6, 9 and 10.

FIG. 11 shows a cascade connection of a digital differentiator 60 and a digital integrator 70, two of which cascade connections may be used in any one of the radio receivers of FIG. 5, 6, 9 and 10. In the digital differentiator 60 a current sample of a digital input signal is supplied as minuend input signal to a digital subtractor 61 and is supplied as input signal to a one-sample-delay circuit 62 as can be constructed from clocked latch circuitry. The previous sample of the digital input signal is supplied from the one-sample-delay circuit 62, where it has been temporarily stored, to be applied to the digital subtractor 61 as subtrahend input signal. Since the ringing energy at final IF frequency is synchrodyned to base band as a comparatively low-frequency signal, as compared to QAM, its current value and its previous value tend to be similar. The difference signal from the subtractor 61 is supplied as the output signal of the digital differentiator 60 and is applied to the digital integrator 70 as its input signal. The difference signal from the subtractor 61 responds little, if any, to the comparatively low-frequency signal generated by synchrodyning the ringing energy at final IF frequency to base band. The difference signal from the subtractor 61 responds to changes in data level with greater strength if the occur within only a few clock intervals.

The digital integrator 70 includes a digital adder 71 connected as an accumulator for the response of the digital differentiator 60. The response of the digital differentiator 60 is supplied as a first summand input to the digital adder 71, and the sum output response from the adder 71 is supplied as input signal to a one-sample-delay circuit 72 as can be constructed from clocked latch circuitry. The one-sample-delay circuits 62 and 72 are clocked at the same rate. The output signal from the one-sample-delay circuit 72 is supplied to the digital adder 71 as a second summand input. The sum output response from the adder 71 is supplied as the output signal from the digital integrator 70.

Modifications can be made to the radio receivers of the types shown in FIGS. 5, 6, 9 and 10 reversing the order of connection both in the cascade connection of the digital differentiator 360 and the digital integrator 38, and in the cascade connection of the digital differentiator 370 and the digital integrator 39. In QAM radio receivers of the types shown in FIGS. 5, 6, 9 and 10 that receive differential QAM or other partial-response filtered QAM, the initial elements of these cascade connections included in the signal paths for developing AGC may also be included in the signal paths for recovering data.

While QAM radio receivers for digital high-definition television transmissions are specifically described herein, the invention its various aspects has application to QAM radio receivers for other DTV transmissions and to QAM radio receivers for digital transmissions not related to television. The QAM radio receivers for digital high-definition television transmissions described with reference to FIGS. 1–6 use triple conversion before synchrodyning to baseband. This is done because the SAW filtering is better accomplished at two higher intermediate frequencies and because analog-to-digital conversion, band-reject filtering of ringing at carrier frequency and complex digital sample generation are better accomplished at lower intermediate frequency. However, receiver designs are possible which embody the invention; which use dual conversion before synchrodyning to baseband; and which do SAW filtering at one higher intermediate frequency before conversion to a lower intermediate frequency prior to analog-to-digital conversion, band-reject filtering of ringing at carrier frequency and complex digital sample generation.

Acquaintance with the foregoing disclosure and its accompanying drawing will enable one skilled in the digital radio receiver art to design other embodiments of the invention besides those described; this should be borne in mind when considering the scope of the claims which follow.

What is claimed is:

1. A gain-controlled radio receiver for receiving quadrature-amplitude-modulated radio-frequency signals susceptible to being accompanied by impulse noise, said radio receiver comprising:

a frequency-selective amplifier for supplying an amplified response to said quadrature-amplitude-modulated radio-frequency signals which amplifier has a midband resonance stimulated by impulse noise that accompanies said quadrature-amplitude-modulated radio-frequency signals from time to time, causing said amplified response to exhibit undesirable ringing;

non-resonant filter circuitry of a phase reinforcement and cancellation type for providing a selective response to the quadrature-amplitude-modulation components of said amplified response as separated from at least a portion of said undesirable ringing; and automatic gain control circuitry for controlling the gain of said gain-controlled radio receiver in response to said selective response to the quadrature-amplitude-modulation components of said amplified response as separated by said non-resonant filter circuitry from said undesirable ringing.

2. The gain-controlled radio receiver of claim 1, wherein the automatic gain control of said gain-controlled radio receiver exhibits a "fast" response responding within a time period in which no more than a hundred quadrature-amplitude-modulation symbols or so are received.

3. The gain-controlled radio receiver of claim 1, further comprising:

an analog-to-digital converter for providing a digital response dependent on the amplified response of said frequency-selective amplifier, in which said gain-controlled radio receiver said non-resonant filter circuitry of a phase reinforcement and cancellation type is finite-impulse-response digital filter circuitry.

4. A gain-controlled radio receiver for receiving quadrature-amplitude-modulated radio-frequency signals susceptible to being accompanied by impulse noise, said radio receiver comprising:

means for selecting one of channels at different locations in a frequency band used for transmitting digital television signals;

a succession of mixers for performing a plural conversion of signal received in the selected channel to a final intermediate-frequency signal;

a respective frequency-selective amplifier between each earlier one of said mixers in said succession of mixers and each next one of said mixers in said succession of mixers, at least one of which frequency-selective amplifiers exhibits a midband resonance stimulated by impulse noise to exhibit undesirable ringing, and at least one of which frequency-selective amplifiers has its gain controlled in response to an automatic gain control signal;

respective local oscillators for supplying oscillations of different frequencies to each of said mixers;

an analog-to-digital converter for recurrently sampling a lowpass response to the signal from the final mixer in said succession of mixers included in said tuner, and for digitizing the resulting samples to generate a digitized final intermediate frequency signal;

a linear-phase digital band-reject filter for receiving said digitized final intermediate frequency signal and supplying a response in which said undesirable ringing is suppressed;

a complex digital sample generation filter responsive to the response of said linear-phase digital band-reject filter for supplying complex digital samples of quadrature-amplitude-modulation in which said undesirable ringing is suppressed;

quadrature-amplitude-modulation synchrodyning circuitry for generating real and imaginary sample streams by synchrodyning said complex digital samples of quadrature-amplitude-modulation to baseband, each of said real and imaginary sample streams having a respective envelope; and automatic-gain-control signal generation circuitry for peak detecting the envelope of at least one of said real and imaginary sample streams, and generating said automatic gain control signal from the result of such peak detection.

5. The gain-controlled radio receiver set forth in claim 4 including:

circuitry for squaring the samples in each of said real and imaginary sample streams, summing concurrent squared samples, and square rooting the sums to develop a sample stream supplied to said automatic-gain-control signal generation circuitry for being peak detected for generating said automatic gain control signal.

6. The gain-controlled radio receiver set forth in claim 4 including:

circuitry for squaring the samples in each of said real and imaginary sample streams and summing concurrent squared samples to develop a sample stream supplied to said automatic-gain-control signal generation circuitry for being peak detected for generating said automatic gain control signal.

7. The gain-controlled radio receiver set forth in claim 4 including:

circuitry for obtaining the absolute values of the samples in each of said real and imaginary sample streams and determining the larger of concurrent absolute values to develop a sample stream supplied to said automatic-gain-control signal generation circuitry for being peak detected for generating said automatic gain control signal.

8. A gain-controlled radio receiver for receiving quadrature-amplitude-modulation radio-frequency signals susceptible to being accompanied by impulse noise, said radio receiver comprising:

means for selecting one of channels at different locations in a frequency band used for transmitting digital television signals;

a succession of mixers for performing a plural conversion of signal received in the selected channel to a final intermediate-frequency signal;

a respective frequency-selective amplifier between each earlier one of said mixers in said succession of mixers and each next one of said mixers in said succession of mixers, at least one of which frequency-selective amplifiers exhibits a midband resonance stimulated by impulse noise to exhibit undesirable ringing, and at least one of which frequency-selective amplifiers has its gain controlled in response to an automatic gain control signal;

respective local oscillators for supplying oscillations of different frequencies to each of said mixers;

an analog-to-digital converter for recurrently sampling a lowpass response to the signal from the final mixer in said succession of mixers included in said tuner, and for digitizing the resulting samples to generate a digitized final intermediate frequency signal;

a complex digital sample generation filter responsive to said digitized final intermediate frequency signal for supplying complex digital samples of quadrature-amplitude-modulation;

quadrature-amplitude-modulation synchrodyning circuitry for generating real and imaginary sample streams by synchrodyning said complex digital samples of quadrature-amplitude-modulation to baseband, each of said real and imaginary sample streams having a respective envelope exhibiting unwanted variations caused by said undesirable ringing;

respective ringing-suppression filters for said real and imaginary sample streams each having a respective envelope exhibiting unwanted variations caused by said undesirable ringing for supplying real and imaginary sample streams each having a respective envelope from which said unwanted variations caused by said undesirable ringing are substantially removed; and circuitry for peak detecting the envelope of at least one of said real and imaginary sample streams from which said unwanted variations caused by said undesirable ringing are substantially removed and generating said automatic gain control signal therefrom.

9. The gain-controlled radio receiver set forth in claim 8, wherein said respective ringing-suppression filters for said real and imaginary sample streams each comprise:

a respective highpass digital filter.

10. The gain-controlled radio receiver set forth in claim 9 wherein said highpass digital filter are each of finite-impulse-response type.

11. The gain-controlled radio receiver set forth in claim 9 including:

circuitry for squaring the samples in each of said real and imaginary sample streams from which said unwanted variations caused by said undesirable ringing are substantially removed by said respective ringing-suppression filters, summing concurrent squared samples, and square rooting the sums to develop a sample stream supplied to said automatic-gain-control signal generation circuitry for being peak detected for generating said automatic gain control signal.

12. The gain-controlled radio receiver set forth in claim 9 including:

circuitry for squaring the samples in each of said real and imaginary sample streams from which said unwanted variations caused by said undesirable ringing are substantially removed by said respective ringing-suppression filters and summing concurrent squared samples to develop a sample stream supplied to said automatic-gain-control signal generation circuitry for being peak detected for generating said automatic gain control signal.

13. The gain-controlled radio receiver set forth in claim 9 including:

circuitry for obtaining the absolute values of the samples in each of said real and imaginary sample streams from which said unwanted variations caused by said undesirable ringing are substantially removed by said respective ringing-suppression filters and determining the larger of concurrent absolute values to develop a sample stream supplied to said automatic-gain-control signal generation circuitry for being peak detected for generating said automatic gain control signal.

14. The gain-controlled radio receiver set forth in claim 8, wherein said respective ringing-suppression filter for said real sample stream comprises a first digital differentiator and a first digital integrator in cascade connection with each other, and wherein said respective ringing-suppression filter for said imaginary sample stream comprises a second digital differentiator and a second digital integrator in cascade connection with each other.

15. The gain-controlled radio receiver set forth in claim 14, wherein said first digital differentiator precedes said first digital integrator in their said cascade connection with each other, and wherein said second digital differentiator precedes said second digital integrator in their said cascade connection with each other.

16. The gain-controlled radio receiver set forth in claim 14 including:

circuitry for squaring the samples in each of said real and imaginary saimple streams from which said unwanted variations caused by said undesirable ringing are substantially removed by said respective ringing-suppression filters, summing concurrent squared samples, and square rooting the sums to develop a sample stream supplied to said automatic-gain-control signal generation circuitry for being peak detected for generating said automatic gain control signal.

17. The gain-controlled radio receiver set forth in claim 14 including:

circuitry for squaring the samples in each of said real and imaginary sample streams from which said unwanted variations caused by said undesirable ringing are substantially removed by said respective ringing-suppressioln filters and summing concurrent squared samples to develop a sample stream supplied to said automatic-gain-control signal generation circuitry for being pealk detected for generating said automatic gain control signal.

18. The gain-controlled radio receiver set forth in claim 14 including:

circuitry for obtaining the absolute values of the samples in each of said real and imaginary sample streams from which said unwanted variations caused by said undesirable ringing are substantially removed by said respective ringing-suppression filters and determining the larger of concurrent absolute values to develop a sample stream supplied to said automatic-gain-control signal generation circuitry for being peak detected for generating said automatic gain control signal.

* * * * *